(12) United States Patent
Nagaraja

(10) Patent No.: US 8,409,909 B2
(45) Date of Patent: Apr. 2, 2013

(54) RANGE MODULATED IMPLANTS FOR IMAGE SENSORS

(75) Inventor: Satyadev Nagaraja, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 286 days.

(21) Appl. No.: 12/830,856

(22) Filed: Jul. 6, 2010

(65) Prior Publication Data
US 2012/0009723 A1    Jan. 12, 2012

(51) Int. Cl.
*H01L 21/00* (2006.01)
(52) U.S. Cl. ............................................ 438/73; 438/75
(58) Field of Classification Search .................... 438/73, 438/75
See application file for complete search history.

(56) References Cited

U.S. PATENT DOCUMENTS

| | | | |
|---|---|---|---|
| 6,329,218 B1 | 12/2001 | Pan | |
| 7,098,067 B2 | 8/2006 | Adkisson | |
| 7,160,753 B2 | 1/2007 | Williams | |
| 7,608,870 B2 | 10/2009 | Cole | |
| 2010/0065938 A1* | 3/2010 | Mabuchi | 257/443 |

* cited by examiner

*Primary Examiner* — Douglas Menz
(74) *Attorney, Agent, or Firm* — Treyz Law Group; Nancy Y. Ru

(57) ABSTRACT

Image sensors have photodiodes separated by isolations regions formed from p-well or n-well implants. Isolation regions may be formed that are narrow and deep. Isolation regions may be formed in a multi-step process that selectively places implants at desired depths in a substrate. Complementary photoresist patterns may be used. To form an implant near the surface of a substrate, a photoresist pattern with openings over the desired implant area may be used. Subsequent implantation may use a complementary pattern such that ions pass through photoresist before implanting in desired regions of a substrate.

7 Claims, 11 Drawing Sheets

RANGE MODULATED IMPLANTS FOR IMAGE SENSORS

BACKGROUND

The present invention relates to integrated circuits and, more particularly, to forming implanted regions in CMOS (complementary metal oxide semiconductor) image sensors.

Digital cameras are often provided with digital image sensors such as CMOS image sensors. Digital cameras may be stand-alone devices or may be included in electronic devices such as cellular telephones or computers. A typical CMOS image sensor has an array of image sensor pixels containing contain thousands or millions of pixels. Each pixel might have a photosensitive element such as a photodiode. Photodiodes are formed in a substrate. Isolation regions may be formed in the substrate between photodiodes to reduce crosstalk between photodiodes. Isolation regions may be formed using ion implantation.

To improve image quality, it is often desirable to increase the number and density of pixels on an image sensor. The density of pixels can be represented by a quantity called "pixel pitch," in which higher pixel pitches represent lower pixel densities and bigger pixel sizes. Each pixel can contain one or more photosensitive elements such as photodiodes. Photodiodes can be separated by isolation regions formed by ion implantation. The percentage of pixel area occupied by photodiode may be referred to as a fill factor. As pixel sizes are reduced, it can become important to decrease the area occupied by isolations regions in order to maintain or maximize the photodiode fill factor. As pixel pitches are decreased, photodiodes may need to be formed deeper in a substrate to avoid loss of sensitivity. Deeper photodiodes may require deeper isolation regions.

When conventional methods are used for implanting isolation regions, it can be challenging to form very narrow and deep isolation regions. Isolation regions are typically formed by implanting ions through the openings of patterned photoresist. If very narrow openings are formed in photoresist, the walls of the openings may be unstable. Narrower openings could be formed in thinner photoresist, but thinner photoresist would limit the permissible energies used during ion implantation and resulting implants would be too shallow. Shallow isolation regions are undesirable because they would limit photodiode depth, reducing the quantum efficiency and sensitivity of the pixels.

It would be therefore be desirable to have improved methods for forming implanted regions.

DETAILED DESCRIPTION

Figure 1:
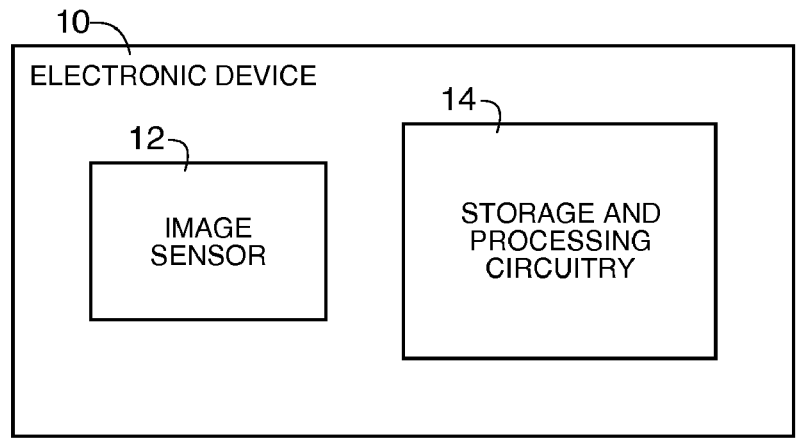
FIG. 1 is a diagram of an illustrative electronic device with an image sensor in accordance with an embodiment of the present invention.

Digital image sensors are widely used in digital cameras and in electronic devices such as cellular telephones, computers, and computer accessories. An illustrative electronic device 10 with an image sensor 12 and storage and processing circuitry 14 is shown in FIG. 1. Electronic device 10 may be a digital camera, a computer, a computer accessory, a cellular telephone, or other electronic device. Image sensor 12 may be part of a camera module that includes a lens or may be provided in a more complex electronic device that has a separate lens. During operation, the lens focuses light onto image sensor 12. Image sensor 12 may also be known as an image sensor array. Image sensor 12 may have an array of image sensor pixels containing photosensitive elements such as photodiodes that convert light into digital data. Image sensors may have any number of pixels (e.g., hundreds, thousands, millions, or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage in circuitry 14. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc.

Figure 2:
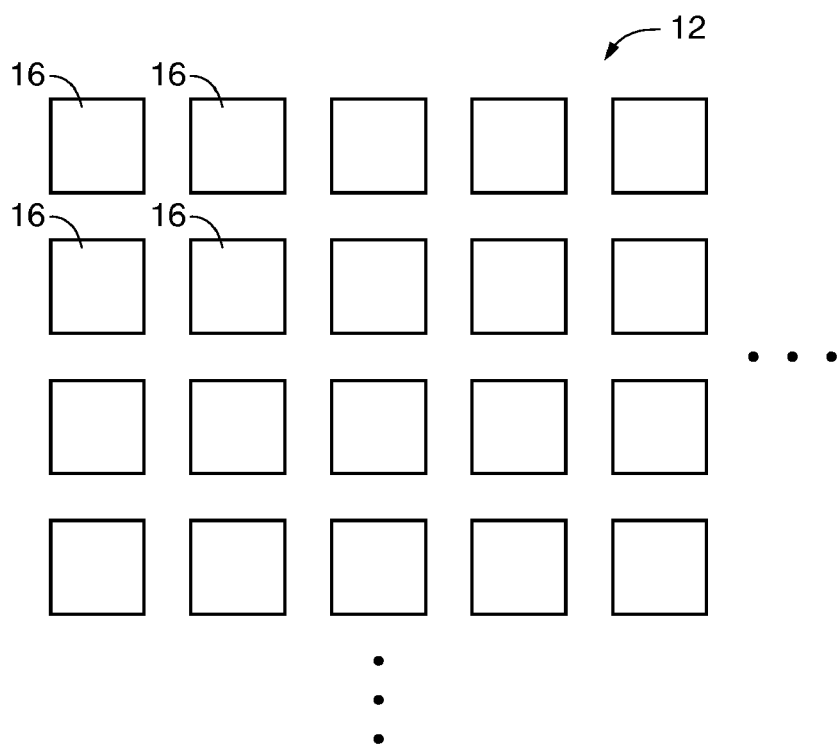
FIG. 2 is a top view of an illustrative image sensor array in accordance with an embodiment of the present invention.

An illustrative image sensor array 12 is shown in FIG. 2. Sensor array 12 of FIG. 2 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals).

Figure 3:
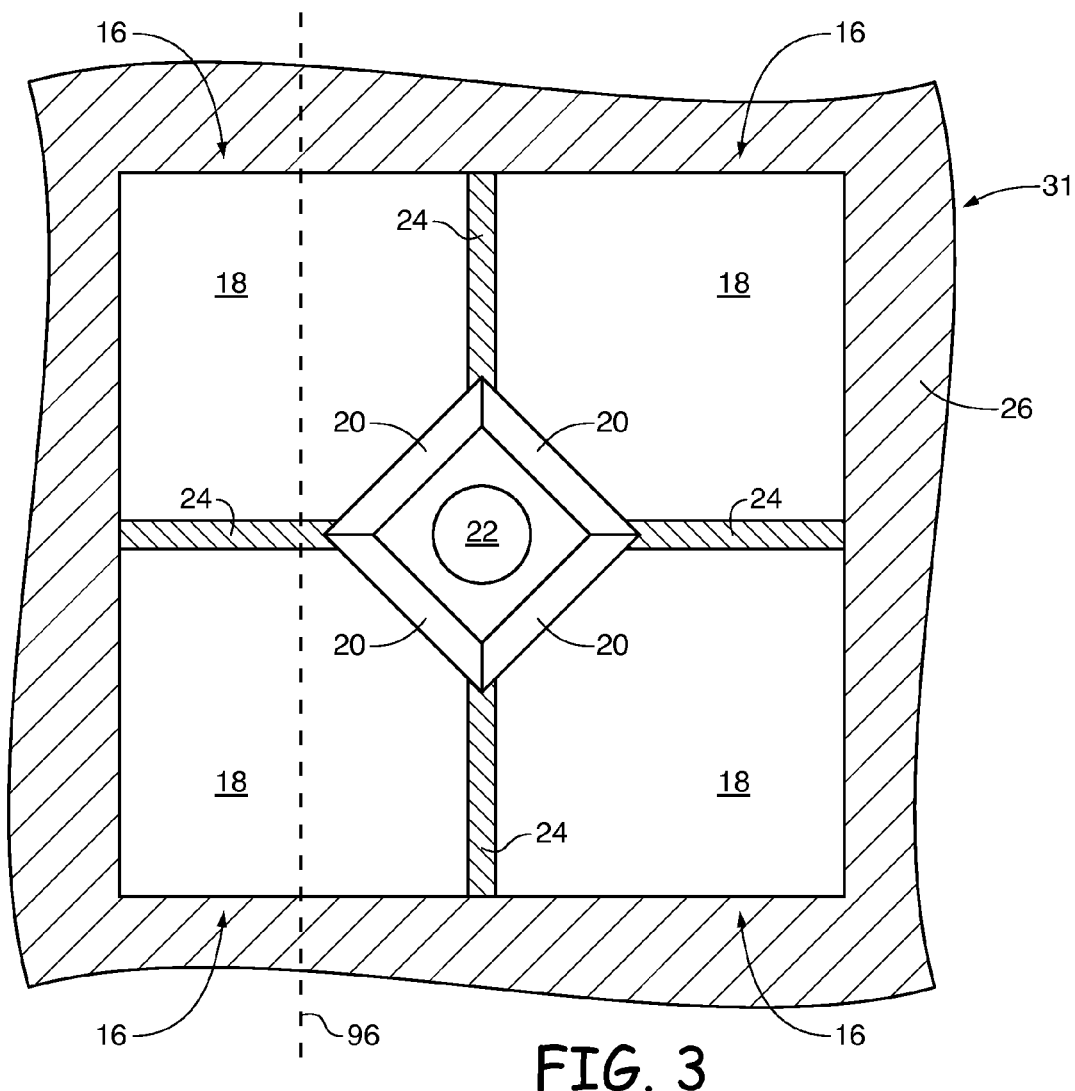
FIG. 3 is a top view of an illustrative image sensor pixel in accordance with an embodiment of the present invention.

FIG. 3 is a diagram of illustrative image sensor pixels 16. In the example of FIG. 3, each pixel 16 has a photodiode 18. Photodiodes 18 may be formed in substrate 31. Photons may strike photodiodes 18 and generate charge. Charge can be transferred to floating diffusion region 22 by turning transfer gates 20 momentarily on. Photodiodes 18 within pixel 16 may be separated by isolation regions 24. Isolation region 26 may separate photodiodes 18 from array transistors and from adjacent pixels.

Substrate 31 may be a silicon substrate. Substrate 31 may, for example, be a doped substrate such as a p-type substrate or a p+ substrate. Substrate 31 may have an epitaxial layer such as a p-type or n-type epitaxial layer. If desired, substrate 31 may be a silicon-on-insulator (SOI) substrate and may have a buried oxide layer (BOX). Isolation regions 24 may be p-well regions or n-well regions. Isolation regions 24 may be formed using ion implantation. For example, ions such as boron, beryllium, indium, magnesium, arsenic, phosphorus or other suitable dopant ions may be implanted in substrate 31 to from regions 24.

Figure 4:
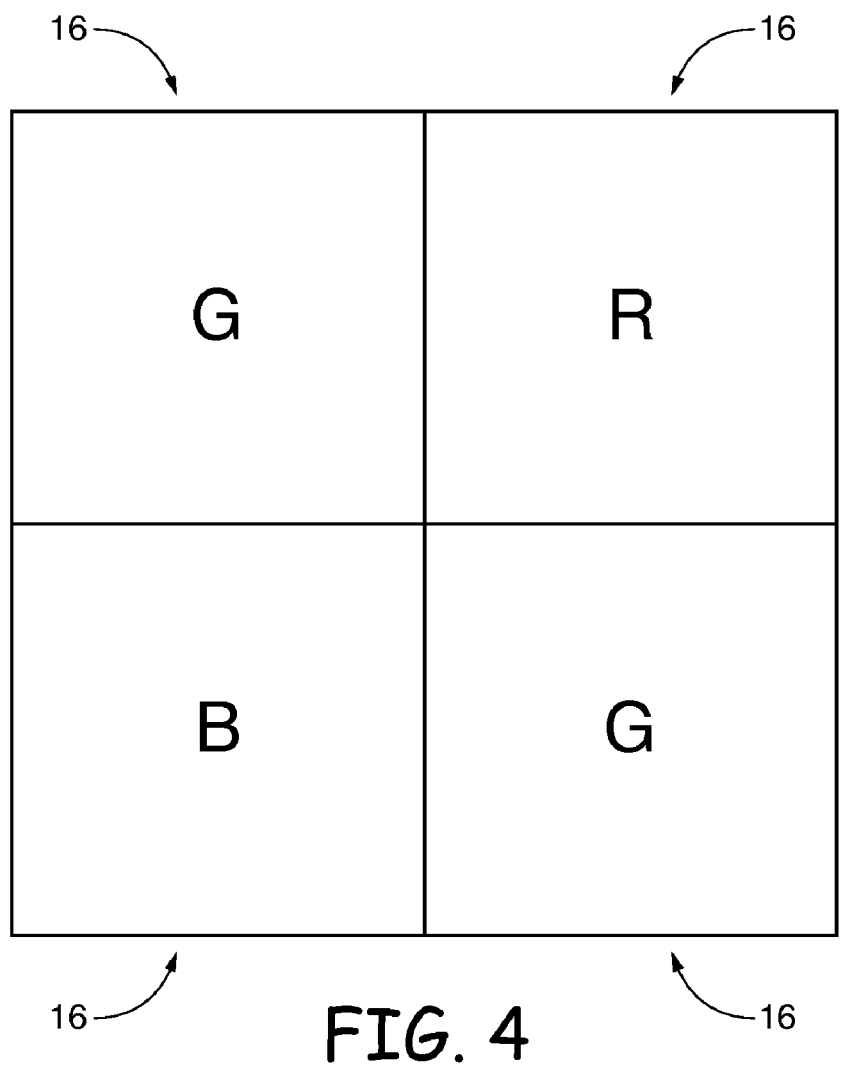
FIG. 4 is a top view of an illustrative color filter for the image sensor pixel of FIG. 3 in accordance with an embodiment of the present invention.

Incoming light may pass through a color filter before striking photodiodes 18 of FIG. 3. FIG. 4 is an illustrative color filter that may filter light for pixels 16 of FIG. 3. The color filter pattern of FIG. 4 has red (R), green (G), and blue (B) pixels 16 and may be known as a Bayer pattern. Four pixels may form a unit for a Bayer pattern (e.g., the four pixels FIG. 3 and FIG. 4). Other patterns may be used for the color filter elements if desired.

The quality of the images that are captured by image sensor 12 is influenced by a variety of factors. For example, the size of the pixel array in image sensor 12 may have an impact on image quality. Large image sensors with large numbers of image pixels will generally be able to produce images with higher quality or resolution than smaller image sensors having fewer image pixels.

In order to increase the number of pixels, it may be desirable to decrease the size of the pixels. It may be desirable to decrease the pixel pitch of an image sensor, which is a measure of the distance between equivalent pixels. For example, pixel pitches for image sensors may be, e.g., 10 microns or less, 5 microns or less, one micron or less, etc. As pixel pitches are reduced, however, it may be desirable to decrease the widths of isolation regions such as isolation regions 24 between photodiodes 18 so that the active portion of the pixels is maximized. Isolation regions may be desired that have widths of, e.g., 2 microns or less, 1 micron or less, 0.5 microns or less, 0.3 microns or less, etc. It may be desirable to have isolation regions that extend from the surface of a substrate to a depth of, e.g. 3-5 microns, 3 microns or more, 4 microns or more, etc. Desired width vs. height aspect ratios for an isolation region may be, for example, approximately 1:8, 1:7 or greater, 1:8 or greater, 1:9 or greater, etc.

The implantation of narrow isolation regions that are suitably deep may present challenges. Typically, photoresist is used as an implant mask. The photoresist is deposited on a substrate and patterned with openings where implants are desired. However, it may be difficult to pattern photoresist where narrow and deep implants are desired. If deep implants are desired, photoresist is needed that is thick enough to stop high beam energies. However, if thick photoresist is patterned with very narrow openings, the walls of the openings may be unstable or sloped instead of vertical, and photoresist residue may remain at the bottom of the opening due to incomplete removal of the resist.

Isolation regions such as isolation regions 24 of FIG. 2 may be formed using a multistep approach that selectively forms implant regions at different depths in a substrate. Such implants may sometimes be referred to as range modulated implants. The implants may be connected to form isolation regions that are suitably narrow and deep. Complementary photoresist patterns may be used as implant masks.

Figure 5:
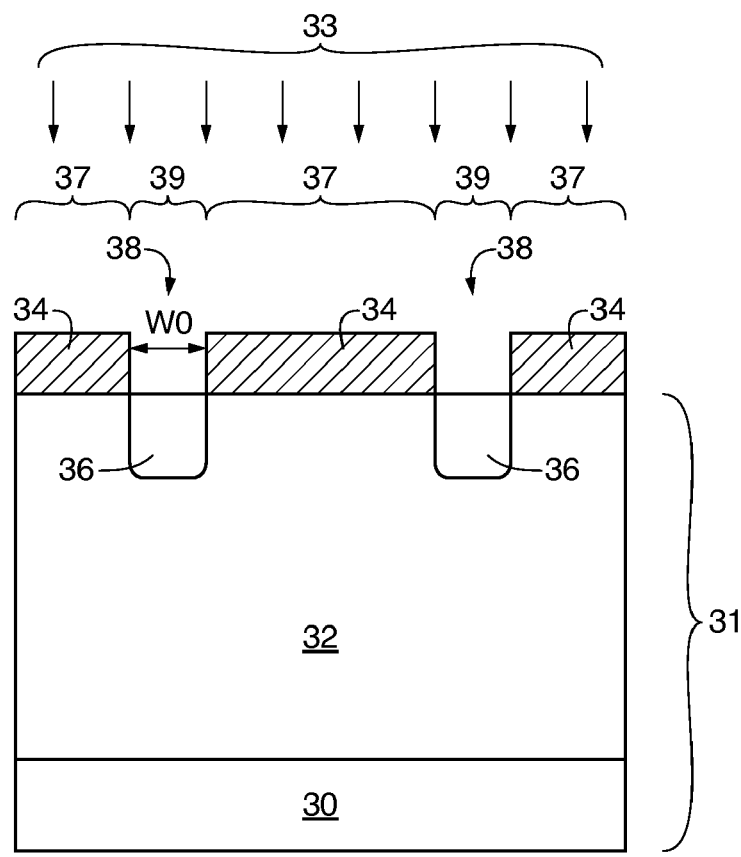
FIG. 5 is a cross sectional side view of a portion of an image sensor showing implants formed through openings in patterned photoresist in accordance with an embodiment of the present invention.

FIG. 5 is a diagram of a substrate 31 that may be used for an image sensor. Substrate 31 has layer 30 such as a p+ or p-type silicon substrate or a buried oxide (BOX) layer. If desired layer 30 may also be an n-type substrate. Substrate 31 may have an epitaxial layer 32 such as an n-type or p-type epitaxial layer. For example, epitaxial layer 32 may be a p-type epitaxial layer that is doped with boron or other suitable dopants. Epitaxial layer 32 may be doped at densities of $10^{14}$-$10^{15}$ cm$^{-3}$ or other suitable densities.

Figure 6:
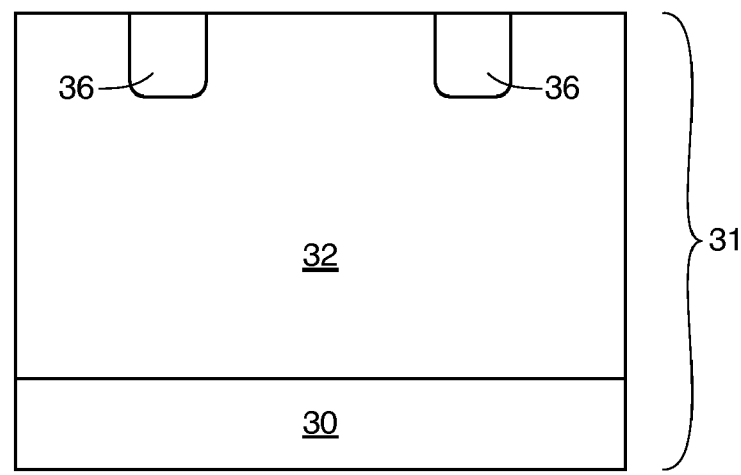
FIG. 6 is a cross sectional side view of a portion of an image sensor showing implanted regions with the photoresist of FIG. 5 removed in accordance with an embodiment of the present invention.

Photoresist 34 may be deposited on the surface of substrate 31. Photoresist 34 may be patterned so that openings 38 are formed in photoresist 34. Openings 38 may be located at regions 39 where isolation regions are desired. Photoresist 34 may be present in regions 37 where isolation regions are not desired. Dopant may be implanted (as shown by arrows 33) through openings 38 in photoresist 34 to form implant regions 36. In regions 37, photoresist stops ions from entering substrate 31. Any suitable ion such as boron may be used to form implants 36. The depth of p-well implants may be determined by ion implantation energy. Maximum ion implantation energies may be determined by the maximum energy that can be stopped by photoresist 34, which is generally affected by the thickness of photoresist 34. In FIG. 6, photoresist 34 of FIG. 5 has been removed.

Conventional methods of ion implantation may incorporate the steps shown in FIGS. 5 and 6. However, such methods generally result in implants that are not suitably deep, because implant depth is limited by the stopping power of photoresist 34 (see, e.g., FIG. 4). In accordance with the invention, the methods of FIGS. 5 and 6 may be augmented using a complementary photoresist technique that produces range modulated implants as shown in, e.g., FIGS. 7-11.

Figure 7:
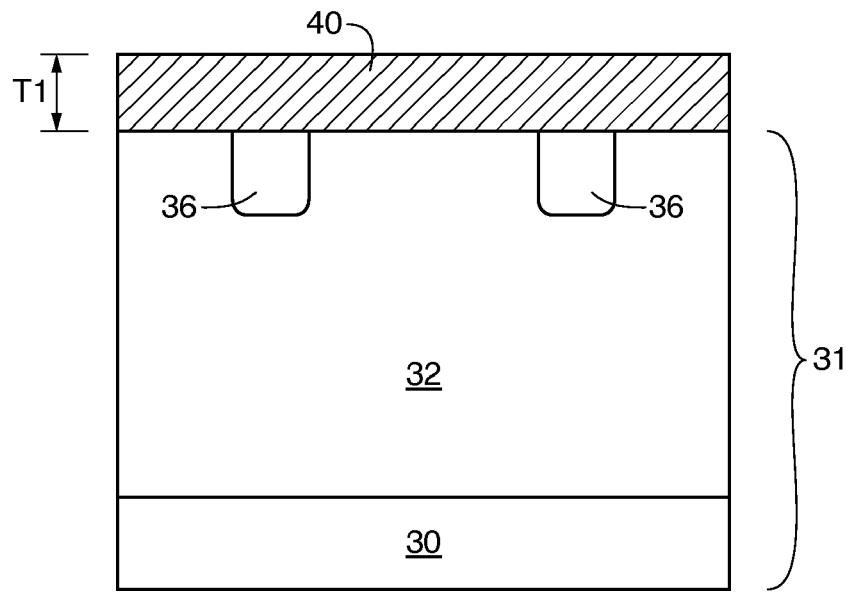
FIG. 7 is a cross sectional side view of a portion of an image sensor showing photoresist deposited over implanted regions in accordance with an embodiment of the present invention.

Implants 36 may be activated in a thermal activation step that moves implanted ions to lattice positions in substrate 31. FIG. 7 shows a blanket layer of photoresist 40 that has been deposited on the surface of substrate 31 following formation of the implants of FIGS. 5 and 6. Photoresist 40 may have a thickness T1.

Figure 8:
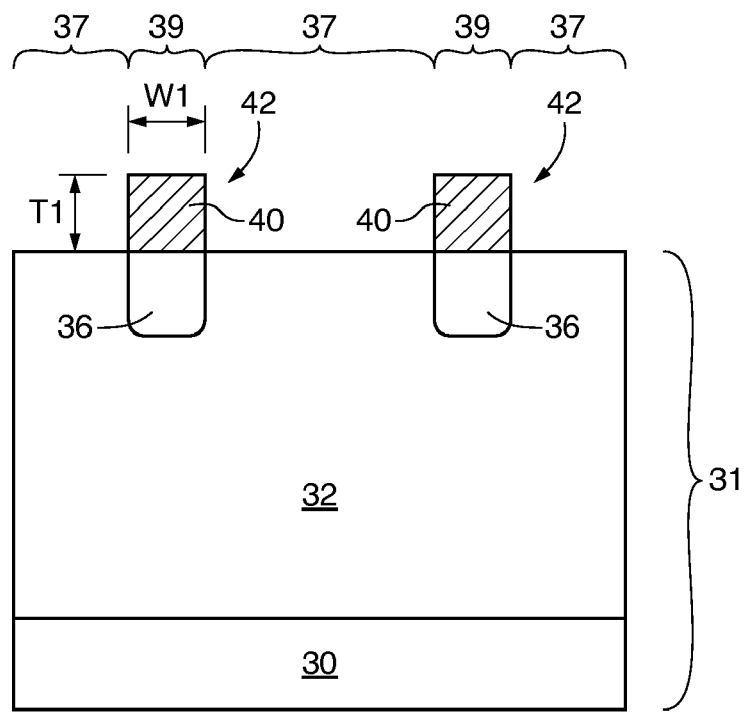
FIG. 8 is a cross sectional side view of a portion of an image sensor showing photoresist patterned with a complementary pattern to the photoresist of FIG. 5 in accordance with an embodiment of the present invention.

As shown in FIG. 8, photoresist 40 may be patterned and openings 42 removed. The remaining photoresist lies directly over isolation regions 36. Photoresist is removed in regions 37 where isolation regions are not desired. The remaining photoresist regions may have a width W1 that is the same or different from width W0 of p-well isolation regions 36. The remaining photoresist may be known as resist islands. Photoresist 40 may have a thickness T1. Photoresist 40 may be patterned with a photomask that is substantially the complement of the photomask used in the patterning step of FIG. 5. The pattern of photoresist 40 may be substantially complementary to the pattern of photoresist 34. For example, photoresist 40 may be substantially complementary to photoresist 34 in that resist islands 40 may be positioned substantially in the same locations as openings 38 in photoresist 34, although widths W1 of resist islands 40 may be slightly smaller or larger than widths W0 of openings 38.

Figure 9:
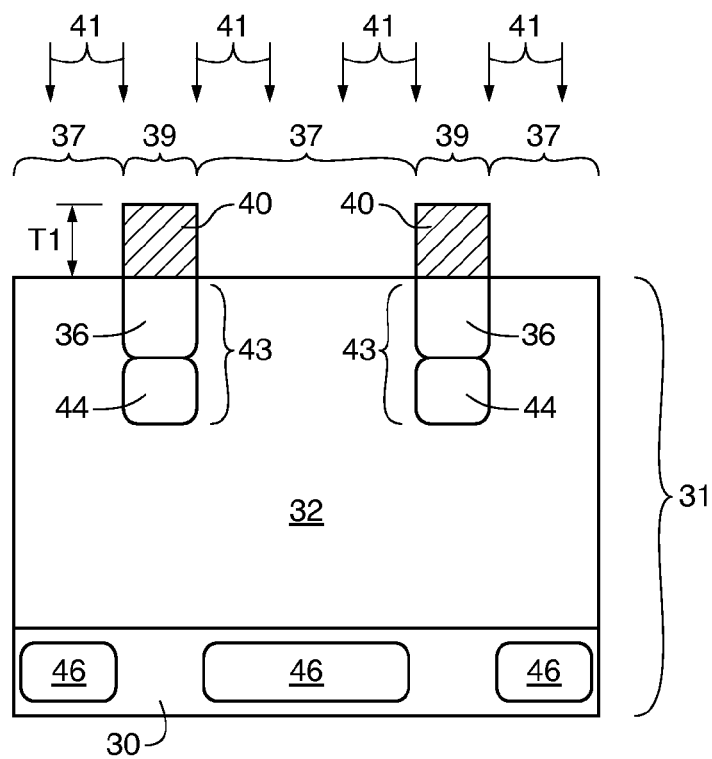
FIG. 9 is a cross sectional side view of a portion of an image sensor showing ion implantation through photoresist patterned with a complementary pattern in accordance with an embodiment of the present invention.
Figure 10:
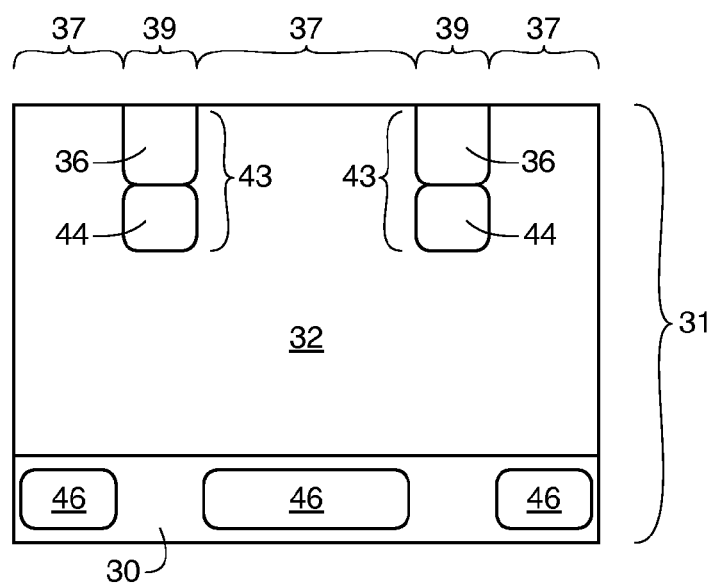
FIG. 10 is a cross sectional side view of a portion of an image sensor showing the removal of the photoresist of FIG. 9 in accordance with an embodiment of the present invention.

As shown in FIG. 9, ion implantation may be performed, as denoted by arrows 41. The implanted ions may be boron ions or other suitable ions. The implanted ions may be the same or different from the ions implanted in the step shown in FIG. 5. In regions 39, ions pass through photoresist 40 and form implants 44. Implants 44 may be below and connected to implants 36 that were formed in the step shown in FIG. 5. Together, implants 36 and 44 may form isolation regions 43. In regions 37 where there are openings in photoresist 40, implants 46 may be formed. Implants 46 maybe formed deep within substrate 31. Implants 46 may be deeper than photodiodes 18 (see, e.g., FIG. 3). The depth of implants 46 may allow the functionality of photodiodes 18 in pixels 16 (see, e.g., FIG. 3) to be unaffected by the presence of implants 46. Implants 46 may, for example, be formed in layer 30 of substrate 31, which may be a p-type substrate, a p+ substrate, a buried oxide layer or other substrate layer (e.g., a layer that is distinct from layer 32). Implantation energies and the thickness of photoresist 40 can be used that ensure that implants 44 form immediately below implants 36. As shown in FIG. 10, photoresist 40 may be removed after implantation operations are complete.

Figure 11:
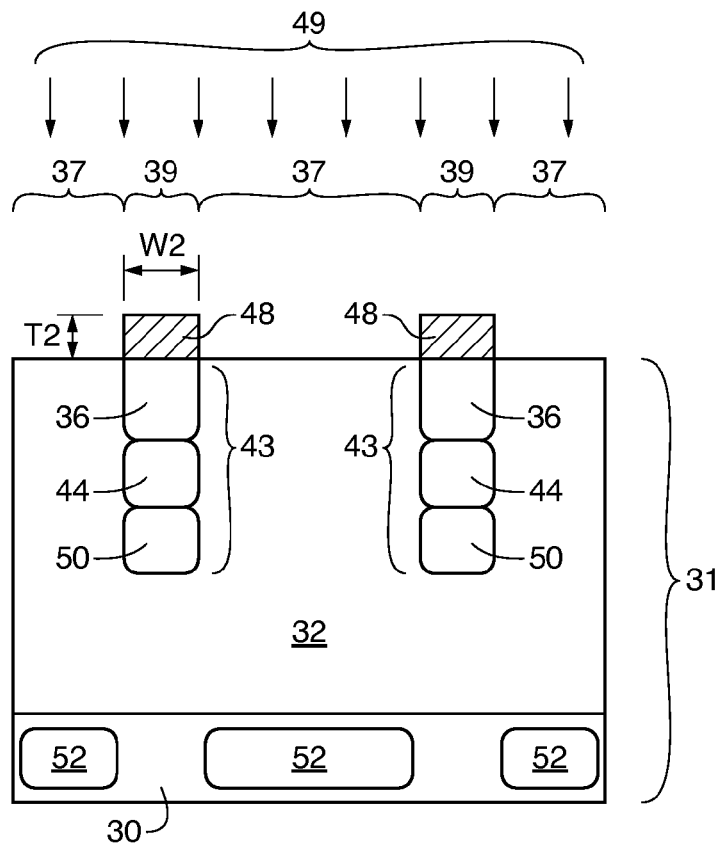
FIG. 11 is a cross sectional side view of a portion of an image sensor showing a second iteration of the steps of FIG. 7-9 in accordance with an embodiment of the present invention.
Figure 12:
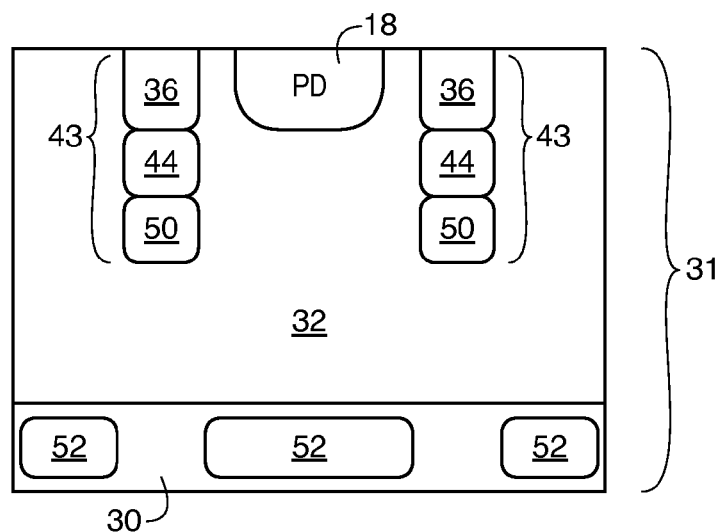
FIG. 12 is a cross sectional side view of a portion of an image sensor showing a photodiode formed between implanted regions in accordance with an embodiment of the present invention.

By using a technique of the type shown in FIGS. 7-10, isolation regions 43 may be formed deeper than if only the single implantation step of FIG. 5 were used. The steps shown in FIG. 7-10 may be repeated if desired. FIGS. 11 and 12 show another application of ion implantation through a complementary photoresist pattern, forming a third range modulated implant for each isolation region 43.

In FIG. 11, photoresist 48 has been deposited on the surface of substrate 31. Photoresist 48 may be patterned in a complementary pattern so that photoresist is retained in areas 39 over isolation region 43 and photoresist is removed in other regions 37. Photoresist 48 may have the same or different pattern and width as photoresist 40 (see, e.g., FIGS. 8 and 9). For example, photoresist 48 may have a pattern that is substantially the same as the pattern of photoresist 40, although width W2 of photoresist 48 may be slightly smaller or larger than width W1 of photoresist 40 of FIG. 8. Photoresist 48 may have a thickness T2. Ion implantation (denoted by arrows 49) may be used to form implants 50 that are underneath and contacting implants 44. Ion implantation energies and photoresist thickness T2 may be selected so that implants 50 are positioned at the desired depth in substrate 31. If an ion implantation energy is used that is the same as the ion implantation used in the step of FIG. 9, when implants 44 were formed, then thickness T2 of photoresist 48 may be selected to be less than the thickness T1 of photoresist 40. Thinner photoresist may allow ions to penetrate deeper within substrate 31.

As shown in FIG. 12, photoresist 48 may be removed. Photodiode 18 may be formed between p-well isolation regions 43 (e.g., using masks, ion implantation, etc.). Photodiode 18 may be formed in substrate 31 before or after p-well isolation regions 43 have been formed.

In the example of FIGS. 5-12, isolation regions 43 each have three range modulated implants (i.e. implants 36, 44, and 50). In general, isolation regions 43 may be formed having any suitable number of range modulated implants. If desired, shallow trench isolation (STI) structures may be formed above range modulated implants.

Figure 13:
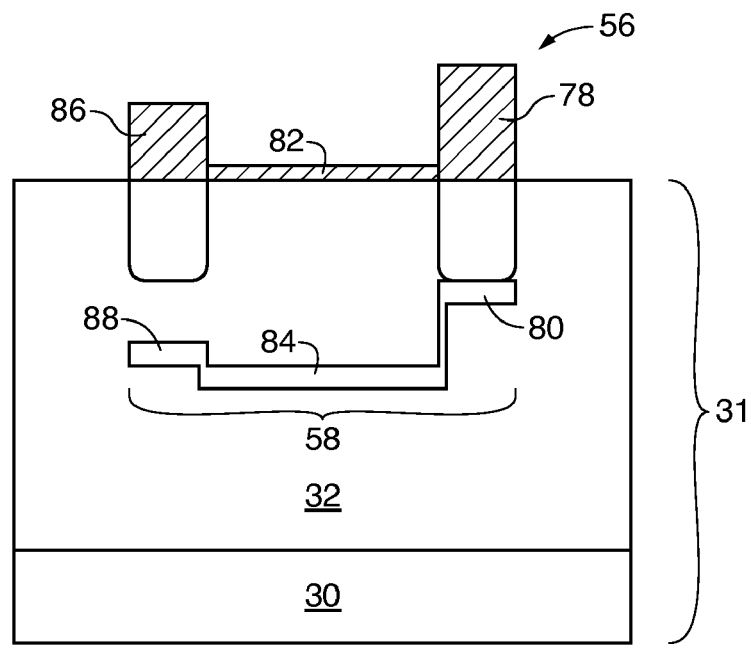
FIG. 13 is a cross sectional side view of a portion of an image sensor showing illustrative implant profiles that may be formed using range modulated implants in accordance with an embodiment of the present invention.

This method may be used to create novel implant profiles in substrates, such as in the example shown in FIG. 13. Photoresist 56 may be deposited and patterned to have a desired topography (e.g., a topography with a variety of different thicknesses). Ion implantation through photoresist 56 may result in implants 58. Implants that lie under thicker photoresist regions may be formed closer to the surface of substrate 31 while implants that lie under thinner photoresist regions may be formed deeper within substrate 31. For example, for the same ion implantation in energy, a thicker photoresist 78 may result in a shallow implant region 80 while a thinner photoresist 82 may result in a deeper implant 84. The implants of FIG. 13 could be formed in one ion implantation step or could be formed in multiple steps. For example, in a first step, photoresist 86 could be deposited and patterned and implant 88 formed. Subsequently, photoresist 86 could be removed, photoresist 82 deposited and patterned, and implant 84 formed.

Figure 14:
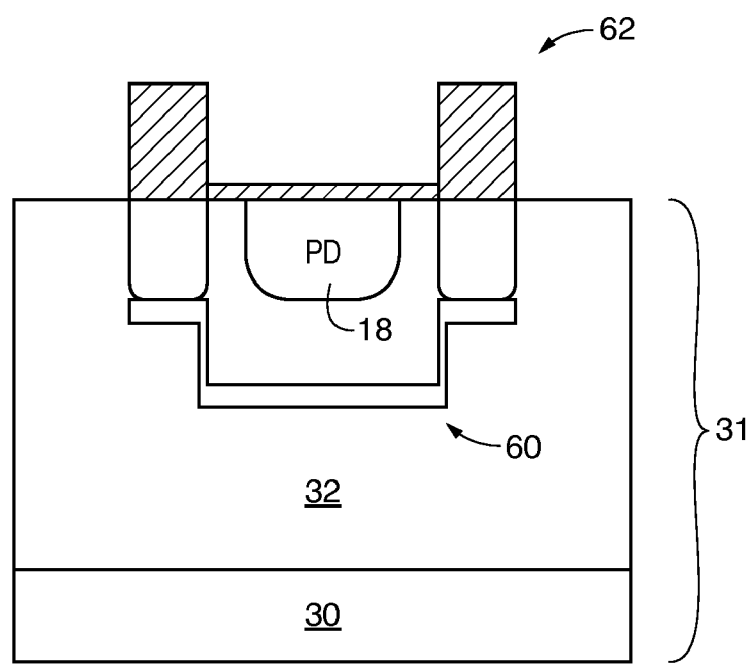
FIG. 14 is cross sectional side view of a portion of an image sensor showing implants formed under a photodiode in accordance with an embodiment of the present invention.

FIG. 14 is an example of isolation regions 60 that may be formed underneath and surrounding photodiode 18. Such isolation regions may be desired for certain specialized photodiodes 18, or for all photodiodes 18 in image sensor 12. Isolation regions 60 may minimize crosstalk between photodiode 18 and other photodiodes.

Figure 15C:
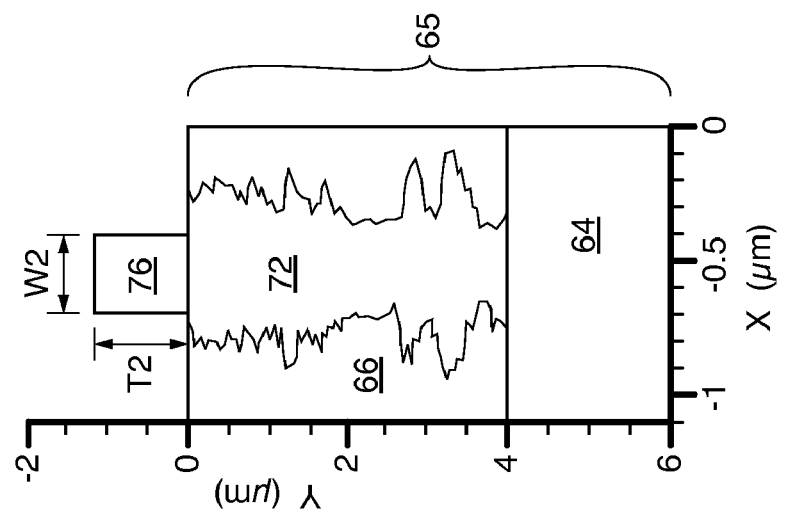
FIG. 15C shows simulation results of an implant formed below and connecting with the implant of FIG. 15B in accordance with an embodiment of the present invention.
Figure 15B:
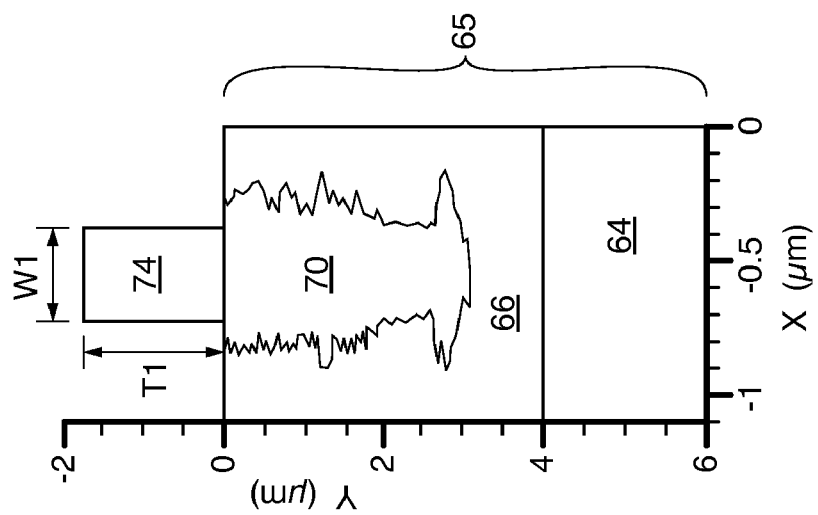
FIG. 15B shows simulation results of an implant formed below and connecting with the implant of FIG. 15A in accordance with an embodiment of the present invention.
Figure 15A:
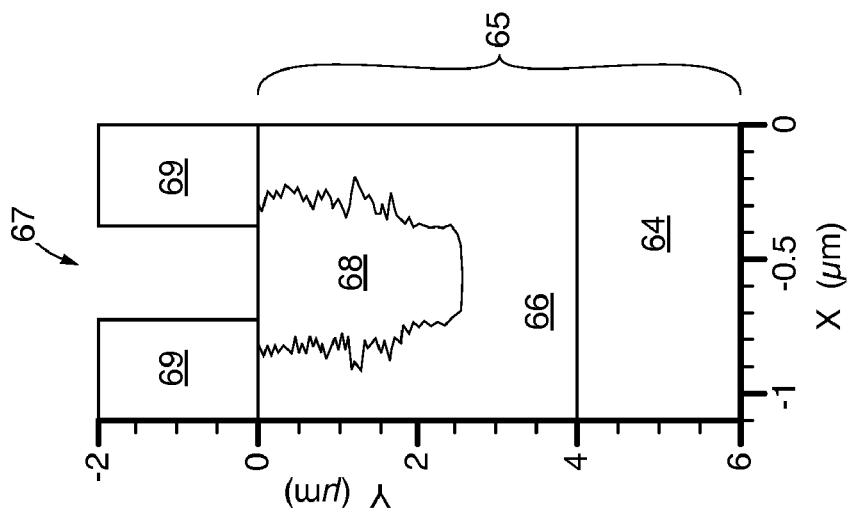
FIG. 15A shows simulation results of an implant formed near the surface of a substrate in accordance with an embodiment of the present invention.

FIGS. 15A-15C show results of simulations. Substrate 65 may have regions 64 and 66. Region 64 may be a p+ substrate. Region 66 may be a p-type or n-type epitaxial layer. FIG. 15A shows a standard p-well implant process with boron having implantation energy up to 950 keV. Photoresist 69 may have a thickness of 2.8 microns. Opening 67 is created in the photoresist 69 and is positioned over the implant. Opening 67 is 0.3 microns wide. Implant 68 may be formed. In the example of FIG. 15A, implant 68 extends to approximately 2.5 microns below the surface of substrate 65.

In FIG. 15B shows an additional boron implantation having an energy of 3200 keV and a dose of 3e11 $cm^{-2}$ is applied. The implantation is applied through a resist island 74 that has a width W1 of 0.3 microns and thickness T1 of 1.8 microns. The implantation process of FIG. 15B extends implant 68 of FIG. 15A to form implant 70 of FIG. 15B. In the example of FIG. 15B, implant 70 extends to approximately 3.5 microns below the surface of substrate 65.

In FIG. 15C, an additional boron implantation having an energy of 3200 keV and a dose of 4e11 $cm^{-2}$ is applied. The implantation is performed through a resist island 76 that has a width W2 of 0.3 microns and a thickness T2 of 1.1 microns thick. In FIG. 15C, implants 70 of FIG. 15B are extended to form implants 72 of FIG. 15C. In the example of FIG. 15C, implant 72 extends to approximately 4 microns below the surface of substrate 65. In the example of FIG. 15C, implant 72 extends to the juncture between layers 66 and 64 of substrate 65. In general, the desired depth of implant 72 may be determined by suitable variety of factors and may not necessarily coincide with a juncture between an epitaxial layer 66 and a substrate 64.

The ion implantation energies used in the examples of FIGS. 15A-C are merely illustrative. Any suitable ion implantation energies may be used. For example, when implants are formed through openings in photoresist, such as in the example of FIG. 15A, ion implantation energies may be e.g., approximately 950 keV, 950 keV or less, 900-1000 keV, 800-1200 keV, etc. When implants are formed through photoresist island such as in the example of FIGS. 15B and 15C, ion implantation energies may be, e.g., approximately 3200 keV, 3500 keV or less, 3000 keV or more, 3000-4000 keV, 2000 keV or more, 2500 keV or more, etc.

Photoresist 69 used in forming implants of the type shown in FIG. 15A may have any suitable thickness. For example, photoresist may have thickness of, e.g., approximately 2.8 microns, approximately 3 microns or less, 2-3 microns, or any suitable thickness.

Photoresist islands such as photoresist islands 74 and 76 may have any suitable dimensions. For example, photoresist islands may have widths of approximately 0.3 microns, 0.2-0.4 microns, less than 0.5 microns, etc. Photoresist islands may have widths that are approximately the same as openings such as opening 67 in photoresist 69 of FIG. 15A. Photoresist islands may have thicknesses of approximately 1.8 microns, 1.1 microns, 1-2 microns, less than 2 microns, less than 3 microns, etc.

Isolation regions may be formed having any suitable depth. In one example, the depth of a photodiode may be 2.5 microns. It may be desirable to have isolation regions that are 0.3-0.4 microns deeper than the photodiode. For example, isolation regions may have depths that are 2.5 microns or more, 3.0 microns or more, 3-4 microns, 4 microns or more, or any suitable depth.

Figure 16:
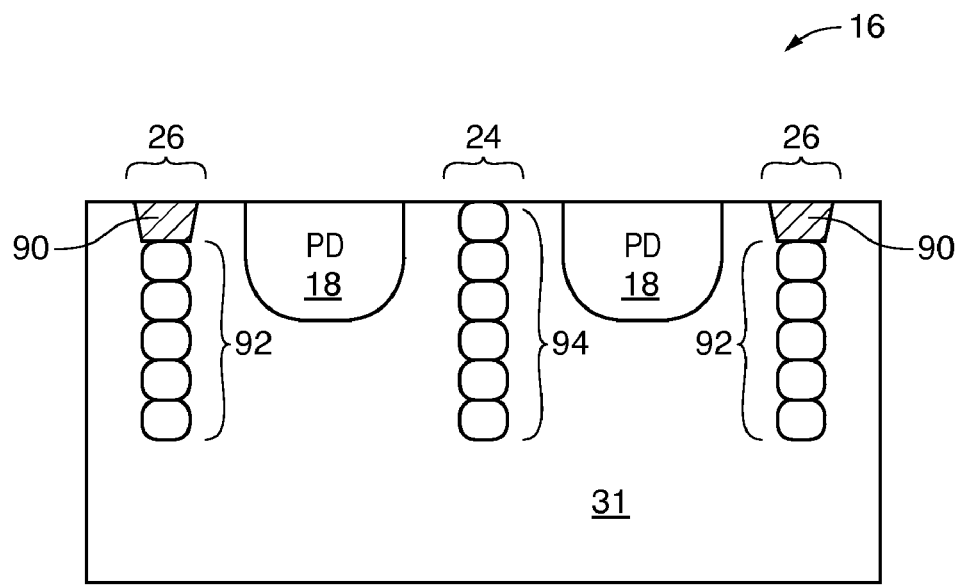
FIG. 16 is a cross-sectional view of the pixel of FIG. 3 in accordance with an embodiment of the present invention.

Shallow trench isolation (STI) structures may be used in combination with implanted regions to form isolation regions for pixels 16. FIG. 16 is a diagram of a cross sectional view taken along dashed line 96 of FIG. 3. In the example of FIG. 16, isolation region 24 between two photodiodes 18 has been formed from a stack of range modulated implants 94. Isolation regions 26 that separate a four-pixel unit from other four-pixel units in image sensor 12 may be formed from STI regions 90 and range modulated implants 92. STI regions 90 may provide additional isolation from transistors that are located in image sensor array 12. The example of FIG. 16 is merely illustrative. Any combination of STI and implanted regions may be used for isolation regions 24 and 26.

Figure 17:
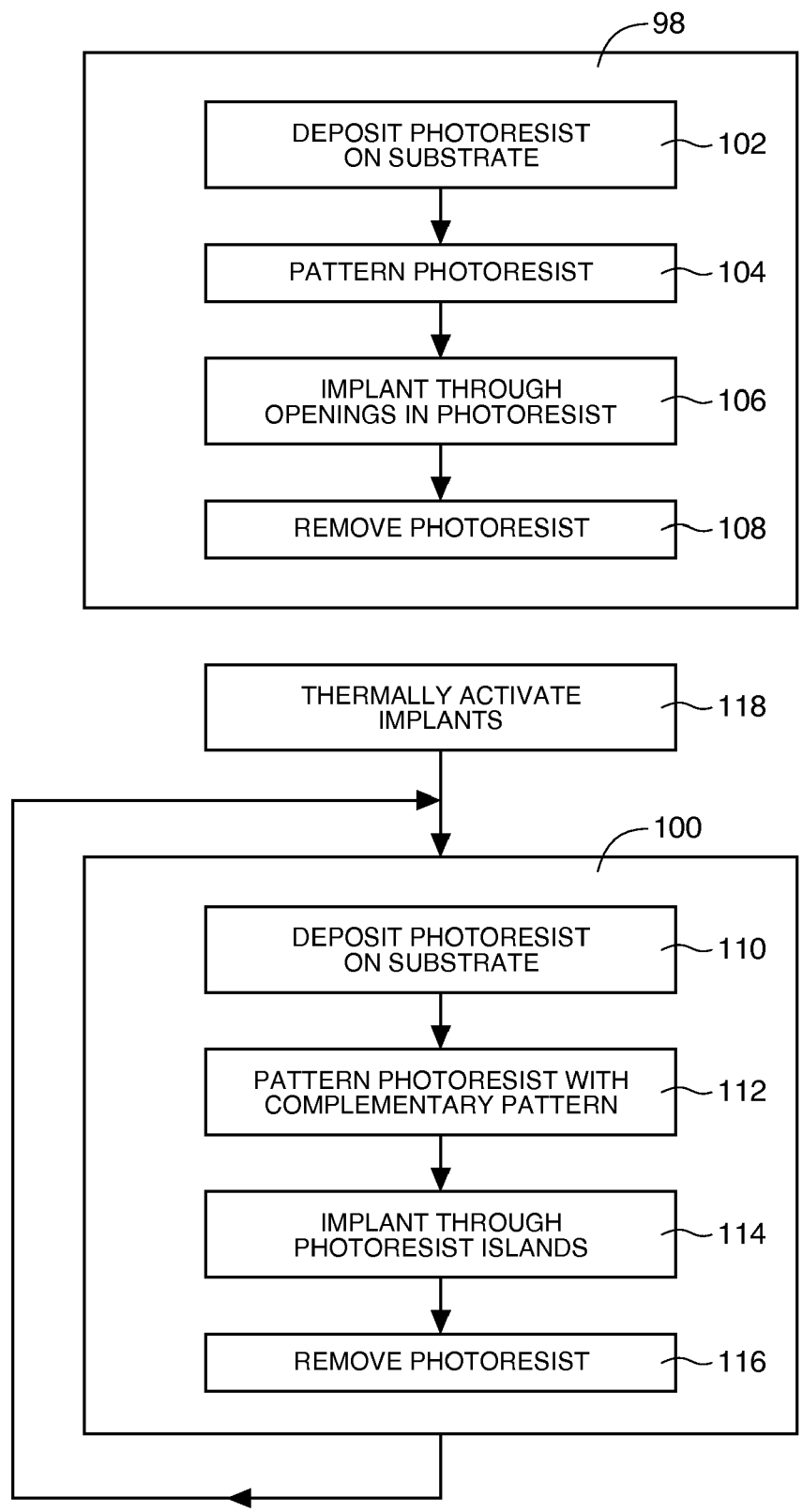
FIG. 17 is a flow chart showing methods of forming range modulated implants in accordance with an embodiment of the present invention.

FIG. 17 is a flow chart showing steps that may be used in forming range modulated implants. In step 98, implants may be formed though openings in a photoresist mask pattern. In step 102, photoresist may be deposited on substrate. In step 104, the photoresist may be patterned to form an implant mask. In step 106, implants may be formed through openings in the photoresist pattern. In step 118, implants may be thermally activated. In step 100, implants may be formed through photoresist islands of a complementary photoresist pattern. In step 110, photoresist may be deposited on a substrate. In step 112, photoresist may be patterned with a complementary pattern. In step 114, implants may be formed through photoresist islands of the complementary pattern. In step 116, the photoresist may be removed.

Steps 100 may be repeated as desired to form a stack of range modulated implants. If desired, steps 98 may be omitted.

The steps of FIG. 17 may be performed any suitable order. For example, thermal activation of implants (step 118) may be performed following the removal of photoresist in step 116. Range modulated implants may also be formed prior to conventional implants. For example, the formation of conventional implants in step 98 may be performed after the formation of range modulated implants in step 100. The formation of conventional implants in step 98 may also be formed in between iterations of the formation of range modulated implants in step 100.

Various embodiments have been described for range modulated ion implantation for image sensors. Complementary photoresist patterns may be used for selectively placing implants at desired depths in a substrate.

Photodiodes separated by narrow isolation regions are provided. The isolation regions may be p-well or n-well regions formed by ion implantation. The isolation regions may be formed in a multi-step process that makes use of photoresist layers patterned with complementary patterns.

In an initial step, photoresist may be deposited on a substrate and patterned to have openings where the implants are desired. Ion implantation may be performed to implant regions below the openings in the photoresist. The photoresist may be removed.

In a subsequent step, photoresist may be deposited on the substrate and patterned with a complementary pattern. The pattern may have openings where no implants are desired, and may have photoresist over the regions where implants are desired. The thickness of the photoresist and ion implantation energies may be carefully selected so that in the implant region, the ions pass through the photoresist and implanted below and connecting with the previously formed implants. In areas without photoresist, the ion implantation may form implant regions deep within the substrate where they will not affect photodiode functionality.

Ion implantation with complementary photoresist patterns may be repeated with varying photoresist thickness and ion implantation energies until a desired depth for the implant has been reached.

The selection of appropriate photoresist thicknesses and implant energies with complementary photoresist patterns allows implants to be selectively placed at desired depths in the substrate. Such implants may be known as range modulated implants.

Shallow trench isolation may be formed over the implanted regions, if desired. Photodiodes may be formed before or after the implanted regions are formed. Implanted regions may be formed below and surrounding photodiodes.

The foregoing is merely illustrative of the principles of this invention which can be practiced in other embodiments.

What is claimed is:

1. A method of forming an image sensor with implanted regions in an image sensor substrate, comprising:
   implanting ions into the image sensor substrate through a first layer of photoresist; and
   implanting ions into the image sensor substrate through a second layer of photoresist, wherein the first and second layers of photoresist have respective patterns and wherein the respective pattern of the second layer of photoresist is substantially complementary to the respective pattern of the first layer of photoresist in that the second layer of photoresist has resist islands that correspond to openings in the first layer of photoresist.

2. The method defined in claim 1, wherein implanting ions through the first layer of photoresist comprises implanting ions into a first region of the substrate below the openings.

3. The method defined in claim 2, wherein implanting ions through the second layer of photoresist comprises implanting ions through the photoresist islands into a second region of the substrate that is below the first region and contacting the first region.

4. The method defined in claim 2, wherein implanting ions through the second layer of photoresist comprises implanting ions into a second region of the substrate that is below the first region and contacting the first region.

5. The method defined in claim 4, further comprising:
implanting ions through a third layer of photoresist into a third region of the substrate that is below the second region and contacting the second region, wherein the third layer of photoresist has a respective pattern that is substantially the same as the respective pattern of the second layer of photoresist.

6. The method defined in claim 4, wherein the substrate comprises a p+ substrate and an epitaxial layer, wherein the first and second regions are in the epitaxial layer, and wherein implanting ions through the second layer of photoresist further comprises implanting ions through openings in the respective pattern of the second layer of photoresist into the p+ substrate.

7. The method defined in claim 4, wherein the substrate comprises a buried oxide layer and an epitaxial layer, wherein the first and second regions are in the epitaxial layer, and wherein implanting ions through the second layer of photoresist further comprises implanting ions through openings in the respective pattern of the second layer of photoresist into the buried oxide layer.

* * * * *